United States Patent [19]
Morimoto

[11] Patent Number: 5,907,356
[45] Date of Patent: May 25, 1999

[54] SOLID-STATE IMAGE PICKUP DEVICE

[75] Inventor: Michihiro Morimoto, Tokyo, Japan

[73] Assignee: NEC Corporation, Tokyo, Japan

[21] Appl. No.: 08/806,475

[22] Filed: Feb. 26, 1997

[51] Int. Cl.⁶ .................................................. H04N 5/335
[52] U.S. Cl. ........................................... 348/311; 257/230
[58] Field of Search .................................... 348/294, 311, 348/312, 313, 314, 315, 317, 322, 241, 250, 248, 249, 319, 320; 257/222, 223, 230, 232, 233; 438/549, 60; H04N 5/335

[56] References Cited

U.S. PATENT DOCUMENTS 5,471,246  11/1995  Nishima et al. ........................ 348/322
5,619,049   4/1997  Kim ........................................ 257/223

FOREIGN PATENT DOCUMENTS 63-150960  6/1988  Japan .

*Primary Examiner*—Tuan V. Ho
*Attorney, Agent, or Firm*—Sughrue, Mion, Zinn, Macpeak & Seas, PLLC

[57] ABSTRACT

In the solid-state image pickup device of the present invention, a two-layer structure of the second diffusion layer of the first conductive type and the third diffusion layer of the first conductive type that has a higher density is uniformly formed as an isolation area along a transfer channel between each photodiode string and each vertical CCD register. Therefore, a constant effective width for the transfer channel is provided and a preferable transfer efficiency is achieved. Further, the occurrence of a punch-through between the photodiode and the vertical CCD register can be prevented, isolation between the photodiode and the vertical CCD register can be ensured, and the reading of electric charges from the photodiode to the vertical CCD register can be performed at a lower voltage.

3 Claims, 5 Drawing Sheets

SOLID-STATE IMAGE PICKUP DEVICE

BACKGROUND OF THE INVENTION

1. Field of the Invention

The present invention relates to a two-dimensional solid-state image pickup device, and in particular to isolation of a CCD type solid-state image pickup device.

2. Description of the Prior Art

FIG. 1 is a diagram illustrating the arrangement of a common interline CCD type solid-state image pickup device. The interline CCD type solid-state image pickup device comprises: a pickup unit 100, wherein are arranged a plurality of rows of photodiodes 101 and a plurality of vertical CCD registers 102, which receive and transfer electric charges from the photodiodes 101; a horizonal CCD register 300, for receiving electric charges from the vertical CCD registers 102 and transferring them via a vertical-horizontal transfer gate 200; an electric charge detector 400, for detecting the electric charges transferred by the horizontal CCD register 300; and an output amplifier 500. The portion enclosed by the broken lines is a unit pixel 103.

A solid-state image pickup device that is disclosed as the second embodiment in Japanese Unexamined Patent Publication No. Sho 63-150960 will now be described as the prior art. FIGS. 2A to 2D are diagrams illustrating a conventional unit pixel. FIG. 2A is a plan view; FIG. 2B is a cross sectional view taken along line IIB—IIB in FIG. 2A; FIG. 2C is a cross sectional view taken along line IIC—IIC in FIG. 2A; and FIG. 2D is a cross sectional view taking along line IID—IID in FIG. 2A. The structure of a pixel will be first described. A P well 2 is deposited on one main face of an N silicon substrate 1. A first N diffusion layer 3, constituting a photodiode 101, is formed in the surface of the P well 2, and a fourth P diffusion layer 4 having a high density is formed on the surface of the first N diffusion layer 3 to suppress the occurrence of a dark current. A second N diffusion layer 5, constituting the vertical CCD register 102, and a P diffusion layer 6 are formed in the named order. A first P diffusion layer 8-1 having a high density is present as an isolation layer on the side between the first and the second N diffusion layers 3 and 5 where a read gate 7 is not located, and a second P diffusion layer 8-2 is present on the other portions as an isolation layer having a low-impurity density. Although not shown in FIGS. 2A through 2D, a channel doping layer may be formed on the read gate 7 in the vicinity of the substrate surface to adjust a threshold voltage. A gate insulating film 9 made of silicon dioxide or silicon nitride is deposited on the surface of the P well 2 of the silicon substrate, and transfer electrodes 10 and 11 made of polysilicon film are formed thereon. A gate insulating film 12 formed of silicon dioxide is also deposited between the transfer electrodes 10 and 11. A light-shielding film (not shown) made of tungsten or aluminum is overlaid, deposited on an intervening insulating film (not shown) made of silicon dioxide. Furthermore, a cover film (not shown) made of silicon dioxide is deposited thereon.

An explanation will now be given for the reading of electric charges from the photodiodes 101 to the vertical CCD register 102, and the relaying of the received electric charges by the vertical CCD register 102. FIG. 3 is a waveform diagram showing a vertical drive pulse that is commonly employed. In FIG. 3 are shown four drive phases. $\phi V1$ through $\phi V4$ are applied by regarding, as a period, four readings for transfer electrodes 11, 10, 11 and 10 that are continuous in the vertical direction. Assume that $\phi V2$ or $\phi V4$ is applied to the transfer electrode 10 and, on the other hand, $\phi V1$ or $\phi V3$ is applied to the transfer electrode 11 that also serves as a read gate. The reading of electric charges from the photodiode 101 to the vertical CCD register 102 is performed in a vertical blanking period using the high level pulse $V_H$. The electric charges read for the vertical CCD register are transferred by the vertical CCD register 102 using low and middle level pulses ($V_L$ and $V_M$). As is shown in FIG. 2D, the transfer electrodes 10 and 11 (more specifically, the coupling lines for connecting, in the direction of columns, the transfer electrodes that correspond to individual pixel strings) overlap, with the insulating film 12 intervening, above the element separation area between the photodiodes 101. Usually, the transfer electrode 10 is located nearer the semiconductor substrate 1 than is the transfer electrode 11. Therefore, for reading, a high-level pulse is not applied to the transfer electrode 10 in the isolation area between the photodiodes 101, and element separation is performed.

The superior feature of this prior art is that the isolation area between the transfer channel (the second N diffusion layer 5) of the vertical CCD register 102 and the photodiode string is uniform.

It is well known that a P diffusion layer, which is an isolation area, is commonly not provided for the read gate 7 (regardless of whether or not there exists a channel doping layer for suppressing a threshold voltage of the read gate). When the width of the transfer channel is 2 $\mu$m or smaller and the effects derived from the short channel becomes noticeable, a problem arises in that unwanted barriers and dips are generated, in the transfer direction, in the distribution of the potentials along the transfer channel. Since, in this prior art, the isolation area is uniform along the transfer channel, there is no deterioration of the transfer efficiency.

Currently, in consonance with the increase in the number of pixels and in the density employed for a solid-state image pickup device, the area of the unit pixel 103 has been reduced to 5 $\mu$m, square. Accordingly, the width of the isolation area between the pixel strings, or between the first and the second N diffusion layers 3 and 5, has been reduced to approximately 0.5 $\mu$m. When the junction depth of the second N diffusion layer 5 is 0.4 to 0.5 $\mu$m, and when the junction depth of the first diffusion layer 3 of the photodiode is about 1 $\mu$m, in a portion 0.4 to 0.5 $\mu$m below the substrate surface, a punch-through to the second N diffusion layer 5 tends to occur.

A problem that arises when a punch-through has occurred will now be explained while referring to FIGS. 4 to 6. FIG. 4 is a graph showing the schematic relationship between substrate voltage $V_{SUB}$ and output voltage $V_{OUT}$. The output voltage is constant when the substrate voltage is $V_{SUB0}$ or lower. This area is a voltage area where photodiode blooming can not be controlled by adjusting the substrate voltage, and is not normally used. The phenomenon called photodiode blooming occurs when irradiation with a strong light causes an excessive amount of electrons in the photodiode and to leak to the vertical CCD register via, for example, the read gate area at a time other than during a reading period, and when a false signal shaped like a white, vertical belt is displayed on a pick-up image. As a well known technique for suppression of photodiode blooming, there is a vertical overflow drain (VOD) structure with which the potential of the P well 2, which is formed under the first N diffusion layer 3 in the photodiode, is controlled by adjusting the substrate voltage, so that when an excessive amount of electrons in the photodiode occurs, the electrons will be discharged toward the substrate to avoid their leaking into the vertical CCD register. That is, referring to FIG. 4, a voltage area at $V_{SUB0}$ or higher is an area where photodiode blooming can be controlled. The higher the substrate voltage goes, the greater is the number of electric charges that are discharged to the substrate side, and the more the output value is reduced.

FIG. 5 is a schematic graph showing the photodiode blooming suppression characteristic. The horizontal axis represents middle level $V_M$ of the vertical drive pulse, and the vertical axis represents substrate voltage $V_{SUB}$. The vertical drive pulse is generally a three-value pulse. When the electric charges are to be read from the photodiode to the vertical CCD register, a pulse of, for example, 15 V (high level: $V_H$) is applied to the transfer electrode 11, and when the received electric charges are to be transferred in the vertical CCD register, a pulse that is changed, for example, from −7 V (low level: $V_L$) to 0 V ($V_M$) is applied to the transfer electrodes 10 and 11 at a predetermined timing. Curve 1 depicts a case where no punch-through has occurred between the photodiode and the vertical CCD register, and curves 2 and 3 depict cases where punch-throughs have occurred. Since along curve 1 the area between the photodiode and the vertical CCD register is cut off, the substrate voltage $V_{SUB0}$ is constant in the area at $V_{M0}$ or below. Points on the individual curves, from the view point of electric charges that have been generated at the photodiode, correspond to the heights of potential barriers on the substrate side and on the vertical CCD register side, where the read area is present, are equal. In other words, photodiode blooming is inhibited in the area above the curves. With $V_M$ being set to $V_{M1}$, the substrate voltage required for inhibiting photodiode blooming is $V_{SUB1}$ when no punch-through has occurred between the photodiode and the vertical CCD register, while it is $V_{SUB2}$ when a punch-through has occurred. The substrate voltages $V_{SUB1}$ and $V_{SUB2}$ are 1 V higher than those at the points on the curves 1 and 2 corresponding to $V_{M1}$. As is apparent from FIG. 4, a problem has arisen in that when a punch-through has occurred, the output voltage is $V_{OUT2}$, which is considerably lower than the output voltage $V_{OUT1}$ when no punch-through has occurred. Although like the curve 1, the curve 3 in FIG. 5, which passes through the substrate voltage $V_{SUB0}$ at $V_{M1}$, can be provided by slightly increasing the density of the element separation layer (the second P diffusion layer 8-2) that has a low impurity density, from this a new problem will arise. A description of this problem follows.

FIG. 6 is a schematic graph showing the characteristic for reading an electric charge from the photodiode to the vertical CCD register. The horizontal axis represents the high level $V_H$ of a vertical drive pulse, the vertical axis represents an output voltage $V_{OUT}$, and when curve 4 represents a case where no punch-through has occurred, between the photodiode and the vertical CCD register, curve 5 represents a case where a punch-through has occurred. The knee-points on the curves identify reading completion voltages for the individual cases. As is apparent from FIG. 6, the reading completion voltage $V_{H2}$ when a punch-through has occurred is higher than the reading completion voltage $V_{H1}$ when no punch-through has occurred. This is because when a punch-through has occurred the reading of electric charges is mainly performed along a channel that is formed in a portion deep inside the substrate, for example, 0.3 to 0.5 µm below the surface, and the reading is less affected by variation in a gate voltage than would be a reading that is performed along a channel at the surface. More specifically, as is shown by the curve in FIG. 5, an increase in the density of the isolation layer (the second P diffusion layer 8-2) that has a low impurity density causes a rise in the reading voltage, and it is difficult, therefore, to avoid a punch-through by controlling the impurity density of only the isolation layer that has a low impurity density. In other words, isolation function between the photodiode and the vertical CCD register in the pixel string is insufficient.

SUMMARY OF THE INVENTION

To overcome the above shortcomings, it is one object of the present invention to provide a solid-state image pickup device that can ensure element separation is performed, and that has a preferable transfer efficiency at a low reading voltage.

To achieve the above object, according to one aspect of the present invention, a solid-state image pickup device comprises:

photodiode strings in each of which a plurality of first diffusion layers of a second conductive type are selectively formed and arranged on a surface of a first conductive area of a semiconductor substrate;

vertical CCD registers, each having a transfer channel consisting of a second diffusion layer of a second conductive type, for receiving electric charges from the first conductive diffusion layers of the second conductive type and for transferring the electric charges;

an image pickup section, being formed on the surface of the first conductive area, in which a plurality of pixel strings, which have read gates that are formed between the first diffusion layers of the second conductive type and the vertical CCD registers, are separately arranged in parallel by first diffusion layers of a first conductive type having a first impurity density that is greater than a density of the first conductive area;

second diffusion layers of a first conductive type that are formed, at a first depth that is shallower than a depth at a bottom level depth of the second diffusion layers of the second conductive type, at the surface of the first conductive area positioned among an arbitrary first diffusion layer of the second conductive type in the pixel string, another first diffusion layer of the second conductive type adjacent to the arbitrary first diffusion layer and the second diffusion layer of the second conductive type which is the transfer channel of the vertical CCD register, and that have a second impurity density higher than the density of the first conductive area and lower than the first impurity density; and third diffusion layers of a first conductive type that are formed, projecting upwards from the bottom levels of the second diffusion layers of the first conducive type, at a second depth below the bottom levels of the second diffusion layers of the second conductive type, and that have a third impurity density greater than the second impurity density.

According to the above aspect, read gate electrodes of the read gate are so formed that they extend, by the interposition of a gate insulating film, across the second diffusion layers of the first conductive type.

According to the above aspect, fourth diffusion layers of a first conductive type are formed on the first diffusion layers of the second conductive type to inhibit a dark current caused in the photodiodes.

As is apparent from the above aspect, in the solid-state image pickup device of the present invention, a two-layer structure of the second diffusion layer of the first conductive type and the third diffusion layer of the first conductive type that has a higher density is uniformly formed as an isolation area along a transfer channel between each photodiode string and each vertical CCD register. Therefore, a constant effective width for the transfer channel is provided and a preferable transfer efficiency is achieved. Further, the occurrence of a punch-through between the photodiode and the vertical CCD register can be prevented, isolation between the photodiode and the vertical CCD register can be ensured, and the reading of electric charges from the photodiode to the vertical CCD register can be performed at a lower voltage.

BRIEF DESCRIPTION OF THE DRAWINGS

FIGS. 2A through 2D are diagrams illustrating prior art, in which FIG. 2A is a plan view of a unit pixel and FIGS. 2B, 2C and 2D are cross-sectional views taken along lines IIB—IIB, IIC—IIC and IID—IID in FIG. 2A, respectively;

FIGS. 7A through 7D are diagrams illustrating one embodiment of the present invention, in which FIG. 7A is a plan view of a unit pixel and FIGS. 7B, 7C and 7D are cross-sectional views taken along lines VIIB—VIIB, VIIC—VIIC and VIID—VIID in FIG. 7A, respectively.

DETAILED DESCRIPTION OF THE PREFERRED EMBODIMENT

One embodiment of the present invention will now be described while referring to the accompanying drawings (FIGS. 7A through 7D).

Figure 7A:
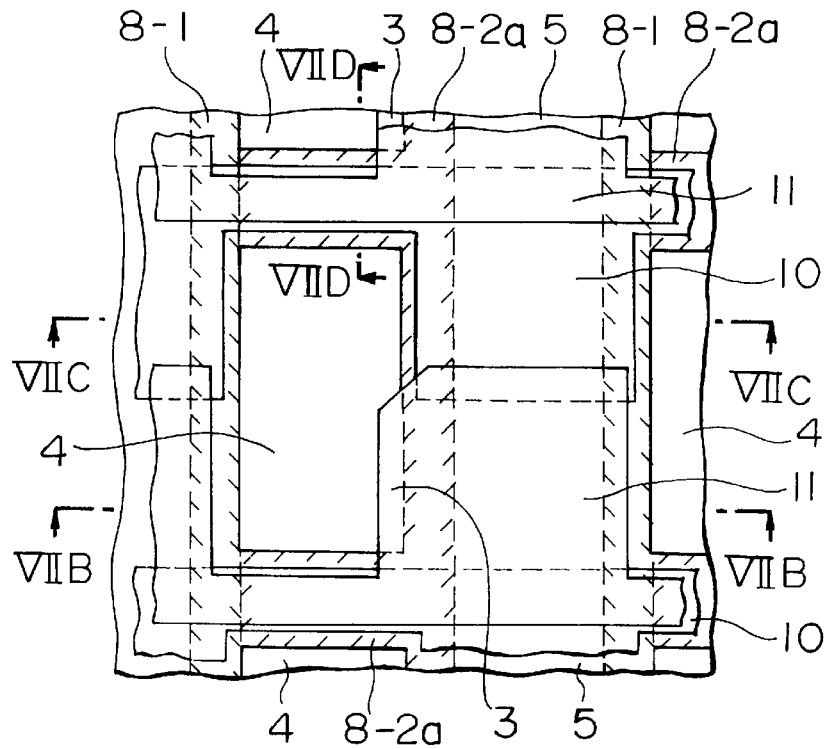
Figure 7B:
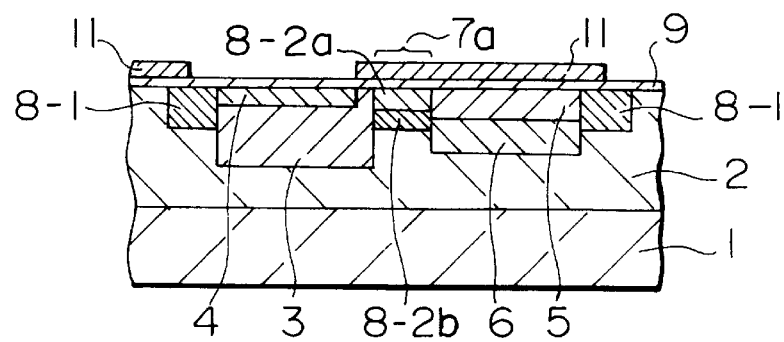
Figure 7C:
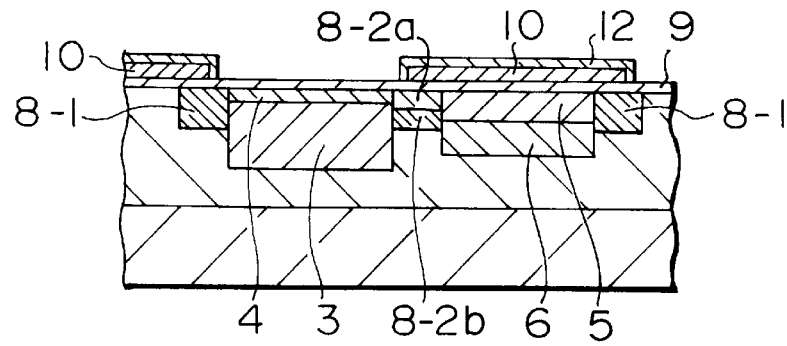
Figure 7D:
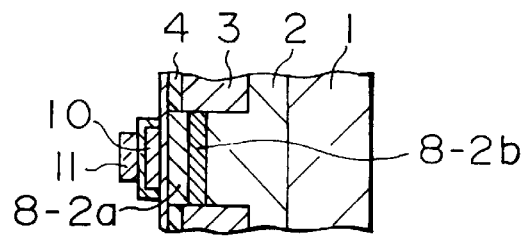

FIG. 7A is a plan view of a unit pixel (see 103 in FIG. 1), and FIGS. 7B, 7C and 7D are cross-sectional views taken along lines VIIB—VIIB, VIIC—VIIC and VIID—VIID in FIG. 7A.

In the embodiment shown in FIGS. 7A through 7D, a solid-state image pickup device comprises photodiode strings, vertical CCD registers, and an image pickup portion. Each photodiode string consists of a plurality of first N diffusion layers 3 (having a junction depth of 1 μm), which are selectively formed in the surface of a first conductive area (a P well 2) deposited on the surface of a semiconductor substrate (an N silicon substrate 1). Each vertical CCD register, component 102 in FIG. 1, includes an N diffusion layer 5 as a transfer channel, a P diffusion layer 6, which contacts the bottom of the N diffusion layer 5 and transfer electrodes 10 and 11, and receives electric charges from each N diffusion layer 3 and transfers them. In the pickup section, each of a plurality of pixel strings (components 104 in FIG. 1) have a read gate 7a formed between the N diffusion layer 3 and the vertical CCD register (the N diffusion layer 5) at the surface of the P well 2, and are arranged in parallel while being isolated by first P diffusion layers 8-1 having a first impurity density of $10^{17}$ to $10^{19}$ cm$^{-3}$, which is higher than that of the P well 2. In the pixel string 104, a second P diffusion layer 8-2a is formed, at a first depth (about 0.3 μm) shallower than that reached by the bottom of the second N diffusion layer 5, at the surface of the P well 2, which is positioned between an arbitrary first N diffusion layer 3 and a second N diffusion layer 5, which is a transfer channel for an adjacent first N diffusion layer 3 and the vertical CCD register 102. The second P diffusion layer 8-2a has a second impurity density of $1\times10^{15}$ to $5\times10^{16}$ cm$^{-3}$, which is higher than that of the P well 2 and lower than the first impurity density of $10^{17}$ to $10^{19}$ cm$^{-3}$. Further, a third P diffusion layer 8-2b is formed at the bottom of the second P diffusion layer 8-2a and extends downward to a second depth (about 0.3 to 0.6 μm) below the bottom of the second N diffusion layer 5. The third P diffusion layer 8-2b has a third impurity density of about $1\times10^{17}$ cm$^{-3}$ that is higher than the second impurity density of $1\times10^{15}$ to $5\times10^{16}$ cm$^{-3}$. The read gate 7a, so formed that it extends across the second P diffusion layer 8-2a by the interposition of a gate insulating film 9, also serves as the transfer electrode 11.

Figure 1:
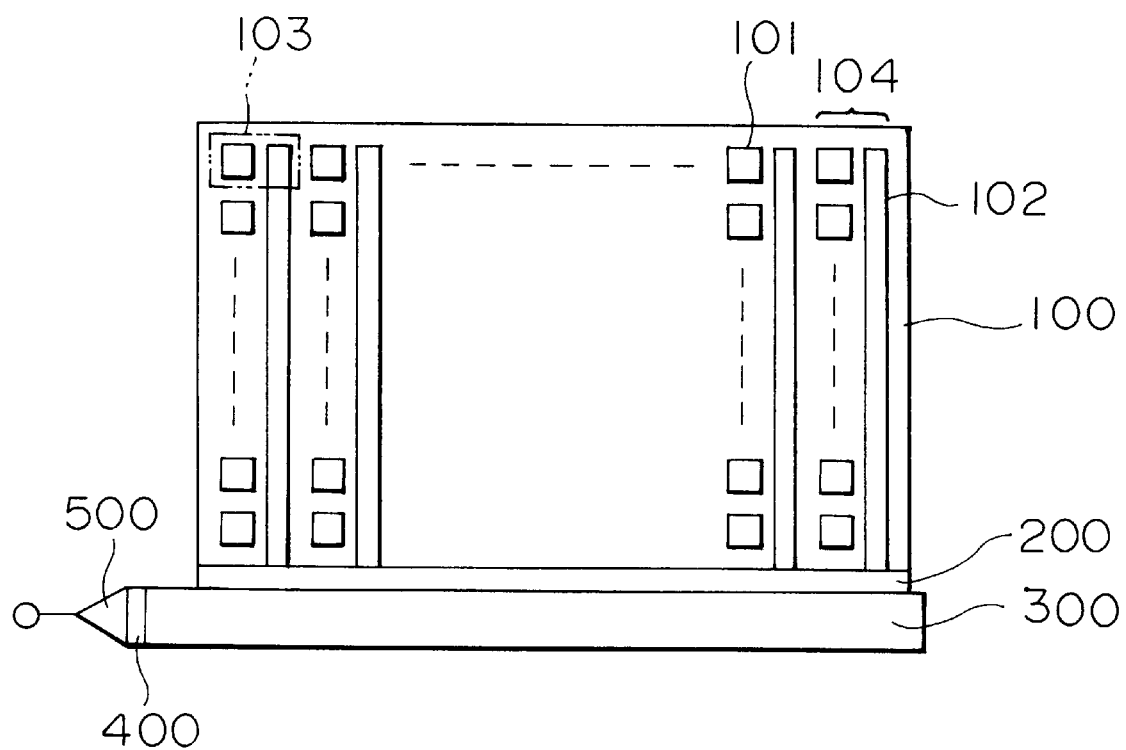
FIG. 1 is a schematic diagram illustrating a common conventional interline CCD type solid-state image pickup device.
Figure 2A:
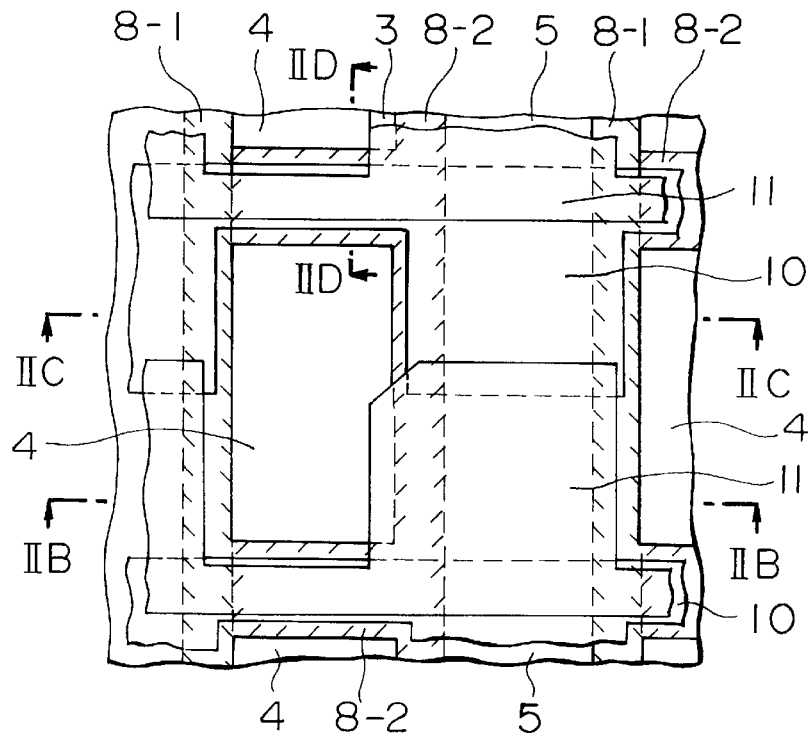
Figure 2B:
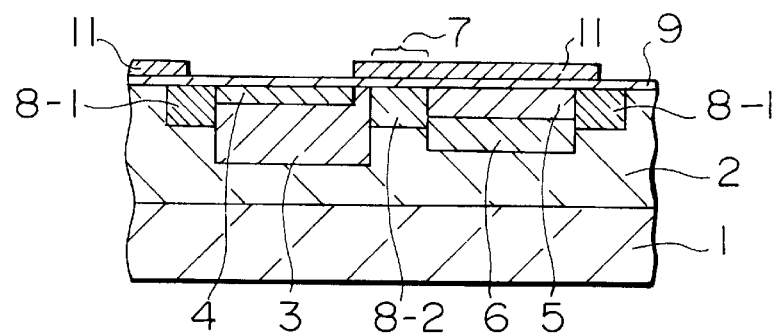
Figure 2C:
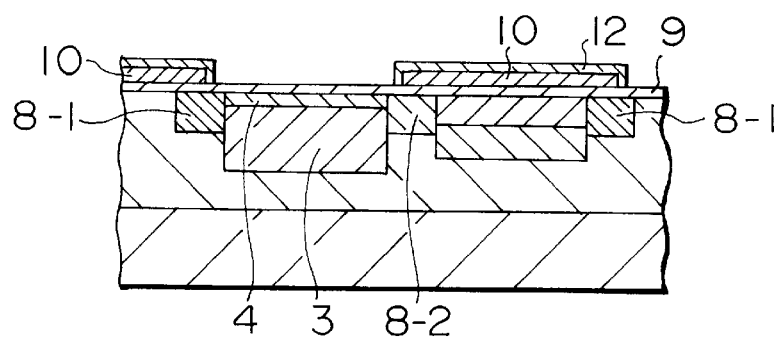
Figure 2D:
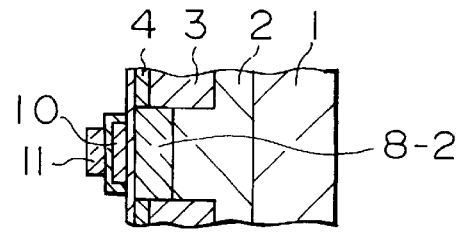
Figure 3:
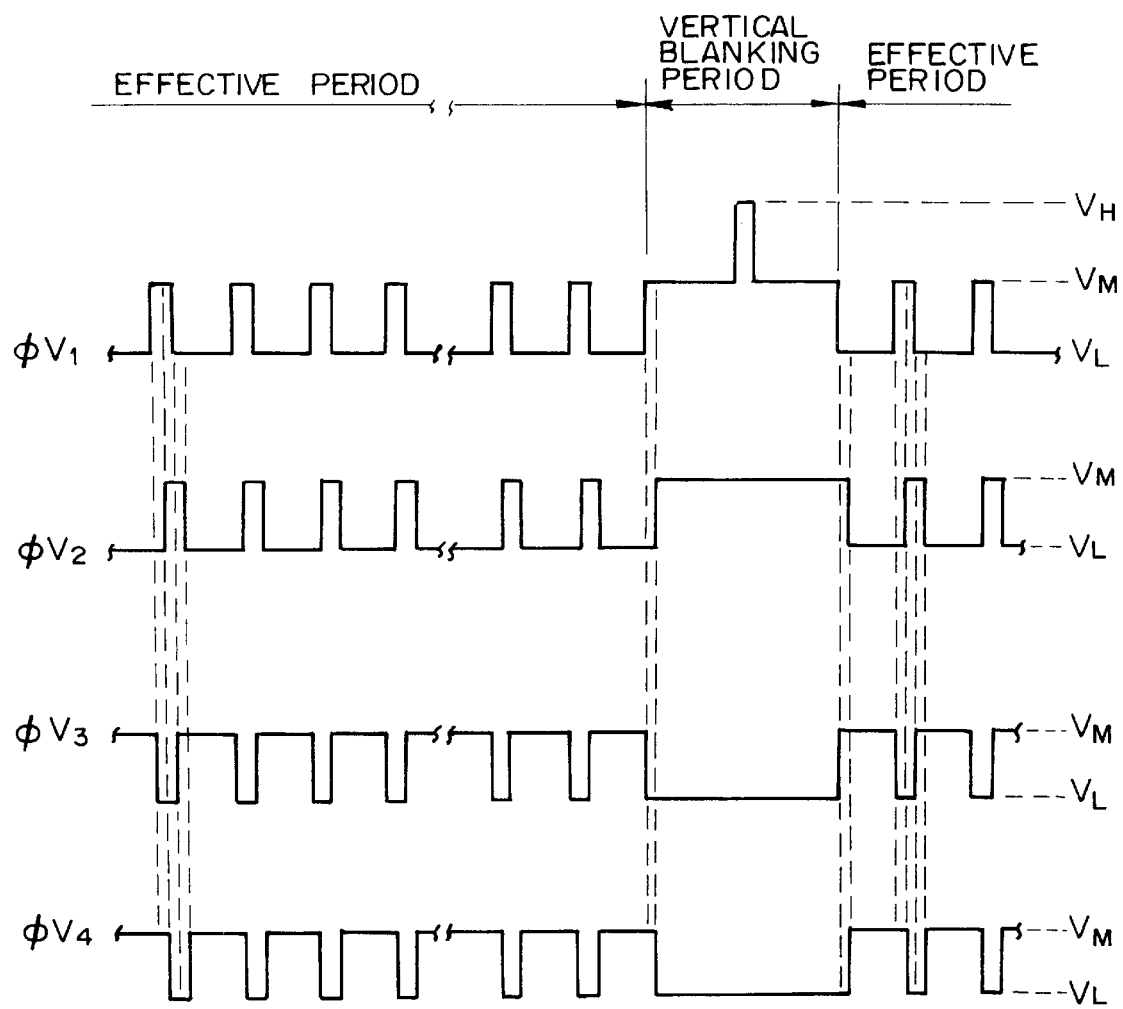
FIG. 3 is a waveform diagram illustrating a general vertical CCD pulse that is conventionally employed.
Figure 4:
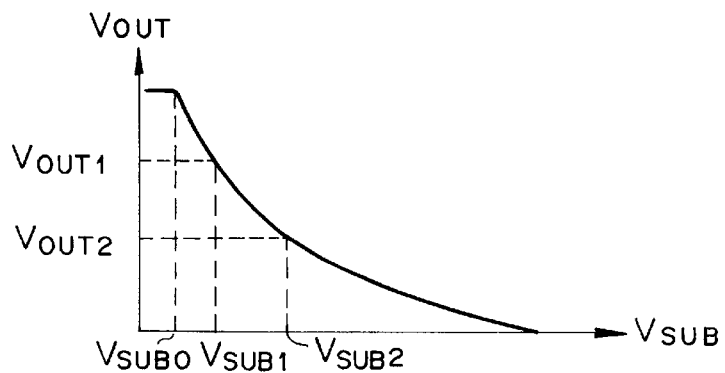
FIG. 4 is a graph showing the relationship between substrate voltage $V_{SUB}$ and output voltage $V_{OUT}$.
Figure 5:
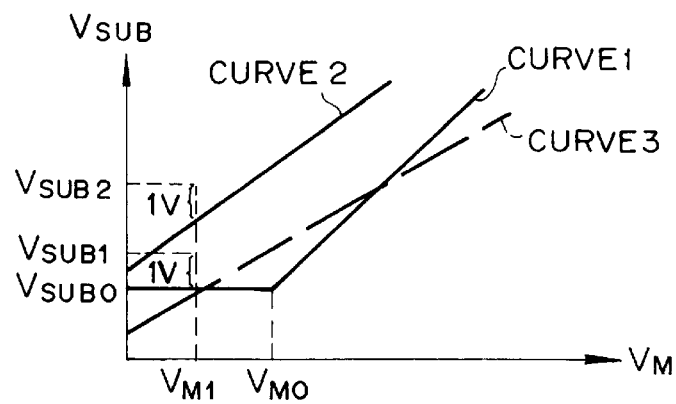
FIG. 5 is a graph showing the characteristic for inhibiting photodiode blooming.
Figure 6:
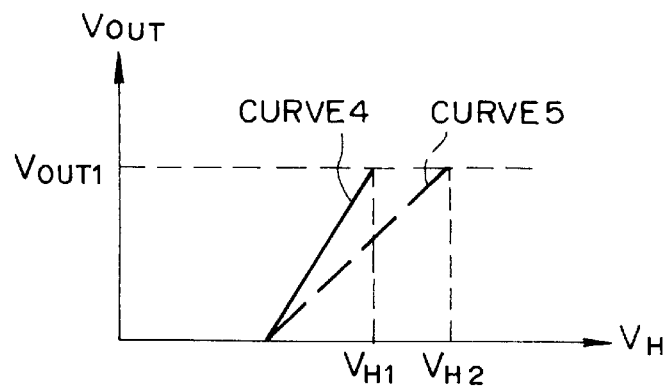
FIG. 6 is a graph showing the characteristic for reading electric charges.

The transfer electrode 10 is the first polysilicon film layer, while the transfer electrode 11 is the second polysilicon film layer. The transfer electrodes 10 and 11 contact the surface of the semiconductor substrate through the gate insulating film (a silicon dioxide film or a silicon nitride film). An insulating film 12, such as a silicon dioxide film, is deposited between the transfer electrodes 10 and 11, and a light shielding film (not shown), composed of a tungsten film or an aluminum film, is formed thereon via an insulating film (not shown) made of a silicon dioxide film. Then, a cover film (not shown) made of a silicon dioxide film is formed on the resultant structure. The vertical-horizontal gate 200 and the horizonal CCD register 300 shown in FIG. 1 are also included.

Since the third P diffusion layer 8-2b, which has a higher density than that of the second P diffusion layer 8-2a, is formed under the second P diffusion layer 8-2a, the occurrence of a punch-through between the photodiode 101 and the vertical CCD register 102 can be prevented when a pulse at the middle level $V_M$ is applied to the transfer electrodes 10 and 11. Thus, when the width of the isolation area is reduced to around 0.5 μm, element separation can be effectively performed. Even when the impurity densities are set as described above, upon the application to the transfer electrode 11 of the pulse at the high level $V_H$, the electric charges in the photodiode 101 can be transferred, at a lower read voltage than conventionally, to the vertical CCD register 102 via a channel that is formed on the surface of the substrate.

What is claimed is:

1. A solid-state image pickup device comprising:

photodiode strings in each of which a plurality of first diffusion layers of a second conductive type are selectively formed and arranged on a surface of a first conductive area of a semiconductor substrate;

vertical CCD registers, each having a transfer channel consisting of a second diffusion layer of a second conductive type, for receiving electric charges from said first conductive diffusion layers of said second conductive type and for transferring said electric charges;

a pickup section, being formed on said surface of said first conductive area, in which a plurality of pixel strings, which have read gates that are formed between said first diffusion layers of said second conductive type and said vertical CCD registers, are separately arranged in parallel by first diffusion layers of a first conductive type having a first impurity density that is greater than a density of said first conductive area;

second diffusion layers of a first conductive type that are formed, at a first depth that is shallower than a depth at a bottom level depth of said second diffusion layers of the second conductive type, at said surface of said first conductive area positioned among an arbitrary first diffusion layer of said second conduction type in said pixel string, another first diffusion layer of the second conductive type adjacent to the arbitrary first diffusion layer and said second diffusion layer of the second conductive type which is the transfer channel of said vertical CCD register, and that have a second impurity density higher than said density of said first conductive area and lower than said first impurity density; and third diffusion layers of a first conductive type that are formed, projecting upwards from said bottom levels of said second diffusion layers of said first conductive type, at a second depth below said bottom levels of said second diffusion layers of said second conductive type, and that have a third impurity density greater than said second impurity density.

2. A solid-state image pickup device according to claim 1, wherein read gate electrodes of said read gate are so formed that said read gate electrodes extend, by the interposition of a gate insulating film, across said second diffusion layers of said first conductive type.

3. A solid-state image pickup device according to claim 1, wherein fourth diffusion layers of a first conductive type are formed on said first diffusion layers of said second conductive type.

* * * * *